US006864107B1

(12) United States Patent
Erhardt et al.

(10) Patent No.: US 6,864,107 B1
(45) Date of Patent: Mar. 8, 2005

(54) DETERMINATION OF NONPHOTOLITHOGRAPHIC WAFER PROCESS-SPLITS IN INTEGRATED CIRCUIT TECHNOLOGY DEVELOPMENT

(75) Inventors: Jeffrey P. Erhardt, San Jose, CA (US); Shivananda S. Shetty, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 103 days.

(21) Appl. No.: 10/459,885

(22) Filed: Jun. 11, 2003

(51) Int. Cl.[7] .......................... H01L 21/66; G01R 31/26
(52) U.S. Cl. ...................... 438/14; 438/17; 324/765; 324/71.5; 716/4
(58) Field of Search ..................... 438/14, 17; 716/4; 700/121; 702/117; 324/765, 71.5

(56) References Cited

U.S. PATENT DOCUMENTS 6,128,403 A * 10/2000 Ozaki ........................ 382/145
6,521,469 B1 * 2/2003 La Rosa et al. ............. 438/17
6,799,909 B2 * 10/2004 Liu et al. .................... 396/611
2002/0193892 A1 * 12/2002 Bertsch et al. .............. 700/31
2003/0036815 A1 * 2/2003 Krishnamurthy et al. .... 700/95

OTHER PUBLICATIONS

Chan et al. (Fast and Accurate Isothermal Measurements on Process–Split Wafers, Integrated Reliability Workshop Final Report, 2001 IEEE International, Oct. 15–18, 2001, Pp. 89–90).*

* cited by examiner

Primary Examiner—Bradley Baumeister
Assistant Examiner—N. Drew Richards
(74) Attorney, Agent, or Firm—Mikio Ishimaru

(57) ABSTRACT

A system of testing wafer process-splits in a semiconductor wafer is provided. A first test is performed on a semiconductor wafer in a plurality of locations to obtain first data. The first data is clustered into a plurality of bins to obtain process-split locations. Second tests are performed on the semiconductor wafer in the process-split locations to obtain second data. The first data and second data are correlated to determine process-split data.

10 Claims, 3 Drawing Sheets

---

PERFORMING A PHYSICAL TEST ON A SEMICONDUCTOR WAFER IN A PLURALITY OF LOCATIONS TO OBTAIN PHYSICAL DATA  202

CLUSTERING THE physical DATA INTO A PLURALITY OF BINS TO OBTAIN PROCESS SPLIT LOCATIONS  204

PERFORMING ELECTRICAL TESTS ON SEMICONDUCTOR devices IN THE PROCESS SPLIT LOCATIONS TO OBTAIN ELECTRICAL DATA  206

CORRELATING THE PHYSICAL DATA AND ELECTRICAL DATA TO DETERMINE PROCESS SPLIT DATA  208

200

DETERMINATION OF NONPHOTOLITHOGRAPHIC WAFER PROCESS-SPLITS IN INTEGRATED CIRCUIT TECHNOLOGY DEVELOPMENT

BACKGROUND

1. Technical Field

The present invention relates generally to semiconductor technology and more specifically to semiconductor research and development.

2. Background Art

Today, electronic products are used in almost every aspect of life, and the heart of these electronic products is the integrated circuit. Integrated circuits are used in everything from airplanes and televisions to wristwatches.

Integrated circuits are made in and on silicon wafers by extremely complex systems that require the coordination of hundreds or even thousands of precisely controlled processes to produce a finished semiconductor wafer. Each finished semiconductor wafer has hundreds to tens of thousands of integrated circuits, each worth hundreds or thousands of dollars.

The ideal would be to have every one of the integrated circuits on a wafer functional and within specifications, but because of the sheer numbers of processes and minute variations in the processes, this rarely occurs. "Yield" is the measure of how many "good" integrated circuits there are on a wafer divided by the total number of integrated circuits formed on the wafer divided by the maximum number of possible good integrated circuits on the wafer. A 100% yield is extremely difficult to obtain because minor variations, due to such factors as timing, temperature, and materials, substantially affect a process. Further, one process often affects a number of other processes, often in unpredictable ways.

In a manufacturing environment, the primary purpose of experimentation is to increase the yield. Experiments are performed in-line and at the end of the production line with both production wafers and experimental wafers. However, yield enhancement methodologies in the manufacturing environment produce an abundance of very detailed data for a large number of wafers on processes subject only to minor variations. Major variations in the processes are not possible because of the time and cost of using production equipment and production wafers. Setup times for equipment and processing time can range from weeks to months, and processed wafers can each contain hundreds of thousands of dollars worth of integrated circuits.

The learning cycle for the improvement of systems and processes requires coming up with an idea, formulating a test(s) of the idea, testing the idea to obtain data, studying the data to determine the correctness of the idea, and developing new ideas based on the correctness of the first idea. The faster the correctness of ideas can be determined, the faster new ideas can be developed. Unfortunately, the manufacturing environment provides a slow learning cycle because of manufacturing time and cost.

Recently, the great increase in the complexity of integrated circuit manufacturing processes and the decrease in time between new product conception and market introduction have both created the need for speeding up the learning cycle.

This has been accomplished in part by the unique development of the integrated circuit research and development environment. In this environment, the learning cycle has been greatly speeded up and innovative techniques have been developed that have been extrapolated to high volume manufacturing facilities.

To speed up the learning cycle, processes are speeded up and major variations are made to many processes, but only a few wafers are processed to reduce cost. The research and development environment has resulted in the generation of tremendous amounts of data and analysis for all the different processes and variations. This, in turn, has required a large number of engineers to do the analysis. With more data, the answer always has been to hire more engineers.

However, this is not a solution for major problems.

The problems include, but are not limited to, the requirement that all nonphotolithographic processes currently involve treatment of an entire wafer at one time. Therefore, it is not possible to perform different experiments of non-photolithographic processes on different areas of the same wafer.

The problems include, but are not limited to, evaluating lot-to-lot differences in parametric tests involving generation of multiple sets of data or families of curves. Often, these curves exhibit certain characteristics, such as inflection points, nodes, etc., which are indicative of product performance of certain known failure mechanisms. Unfortunately, evaluation of the curves requires "expert" eyes because the differences can be extremely subtle.

The problems include, but are not limited to, the need to statistically collect large amounts of current versus voltage data.

The problems include, but are not limited to, improving photolithography focus exposure matrix design comparisons.

Solutions to these problems have been long sought but prior developments have not taught or suggested any solutions and, thus, solutions to these problems have long eluded those skilled in the art.

DISCLOSURE OF THE INVENTION

The present invention provides a system for testing wafer process-splits in a semiconductor wafer. A physical test is performed on a semiconductor wafer in a plurality of locations to obtain physical data. The physical data is clustered into a plurality of bins to obtain process-split locations. Electrical tests are performed on the semiconductor wafer in the process-split locations to obtain electrical data. The physical data and electrical data are correlated to determine process-split data This system provides a means to accomplish physical and electrical process-splits on a single wafer using a nonphotolithography process, which simulates focus exposure matrix (FEM) eliminating wafer-to-wafer variations.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
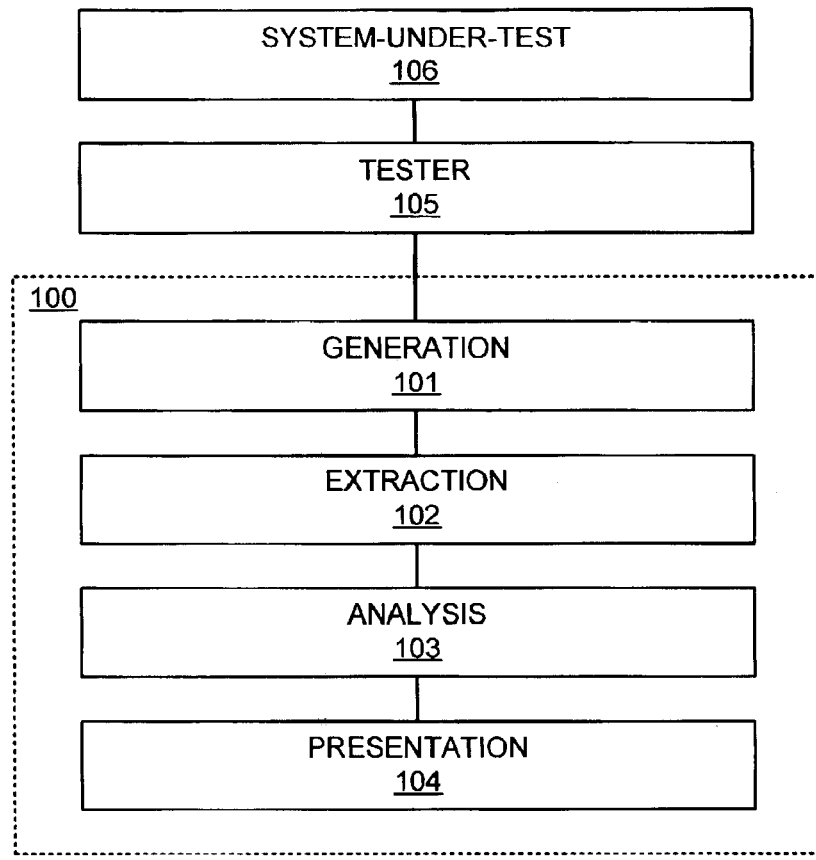
FIG. 1 is a block diagram of a tester information processing system according to the present invention.

Referring now to FIG. 1, therein is shown a block diagram of a tester information processing system 100 according to the present invention. The tester information processing system 100 is the result of the discovery that at times a single fundamental block can solve the problems presented but often there are four fundamental blocks to solving the problems presented.

The four fundamental blocks are a generation block 101, an extraction block 102, an analysis block 103, and a presentation block 104. Each of the blocks can stand independently in the tester information processing system 100, and within these blocks are various commercially available techniques, methodologies, processes, and approaches as well as the invention disclosed herein. The four fundamental blocks are discussed in the approximate chronology that the blocks are used in the tester information processing system 100.

The tester information processing system 100 includes various pieces of commercially available production, test, research, and development semiconductor equipment, specialized circuitry, and/or computers, which operate on and manipulate information and/or data, which are generically defined herein as "information". The tester information processing system 100 receives information from a tester 105, which is connected to a system-under-test 106.

In the integrated circuit field, the tester 105 can be a semiconductor test system for testing wafers or die and the system-under-test 106 can be anything from a complete wafer down to an element of an individual semiconductor device on a die.

In the generation block 101, basic information is generated looking at new and old products, new and old processes, product and process problems, unexpected or unpredictable results and variations, etc. Generation of the information may use the tester 105 itself, a conventional test information, a personal computer, etc. It may also require new equipment and/or methods, which are described herein when required.

In the extraction block 102, usable information is extracted from the generated information from the generation block 101. Essentially, the generated information is translated into more useful forms; e.g., broken apart so it can be reassembled in different forms to show different interrelationships. For example, most testing equipment provides raw data in massive test files. Sometimes, millions of measurements provide millions of pieces of information, which must be digested and understood. The test files seldom have a user-friendly tabular output of parameter and value. Even where somewhat user-friendly outputs are provided, there are problems with the proper schema for storing the usable data and for formatting the data for subsequent analysis.

Extraction of the usable information may also require new equipment and/or methods. Sometimes, extraction includes storing the information for long duration experiments or for different experiments, which are described herein when required.

In the analysis block 103, the usable information from the extraction block 102 is analyzed. Unlike previous systems where a few experiments were performed and/or a relatively few data points determined, the sheer volume of experiments and data precludes easy analysis of trends in the data or the ability to make predictions based on the data. Analysis of the extracted information may also require new equipment and/or methods, which are described herein when required.

In the presentation block 104, the analyzed information from the analysis block 103 is manipulated and presented in a comprehensible form to assist others in understanding the significance of the analyzed data. The huge amount of analyzed information often leads to esoteric presentations, which are not useful per se, misleading, or boring. Proper presentation often is an essential ingredient for making informed decisions on how to proceed to achieve yield and processing improvements. In some cases, problems cannot even be recognized unless the information is presented in an easily understood and digested form, and this often requires new methods of presentation, which are described herein when required.

Figure 2:
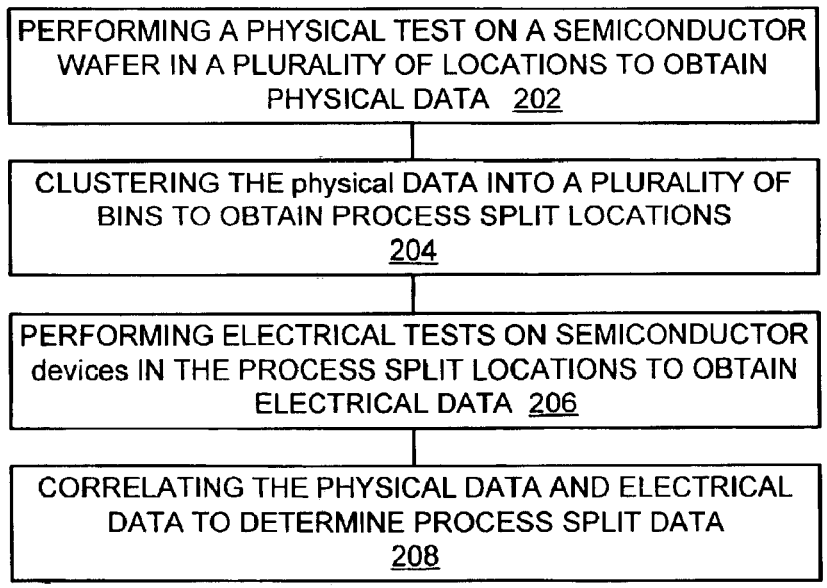
FIG. 2 is a simplified process-split procedure system according to the present invention.

Referring now to FIG. 2, therein is shown a simplified process-split procedure system 200 according to the present invention. The simplified process-split procedure system 200 shows a step 202 of performing a physical test on a semiconductor wafer in a plurality of locations to obtain physical data; a step 204 of clustering the data into a plurality of bins to obtain process-split locations; a step 206 of performing electrical tests on a semiconductor wafer in the process-split locations to obtain electrical data; and a step 208 of correlating the physical data and electrical data to determine process-split data.

While it has been possible to use photolithography focus exposure matrix (FEM) techniques to perform process-splits on a single waver, i.e., perform a number of process experiments on a single wafer, there has been no method of obtaining the same results for other semiconductor processes. The problem is that all other nonphotolithographic processes involve a process treatment to an entire wafer at one time, which it has been believed, creates a uniform wafer so those skilled in the art have assumed that process-split testing cannot be performed.

It has been discovered that every nonphotolithographic process will always create localized nonuniformities on the wafer during processing. While these processing nonuniformities may be very, very slight, they are always present.

It has been discovered by collecting detailed on-wafer, in-line metrology data, it is possible to simulate the FEM technique for nonphotolithographic processes.

Figure 3:
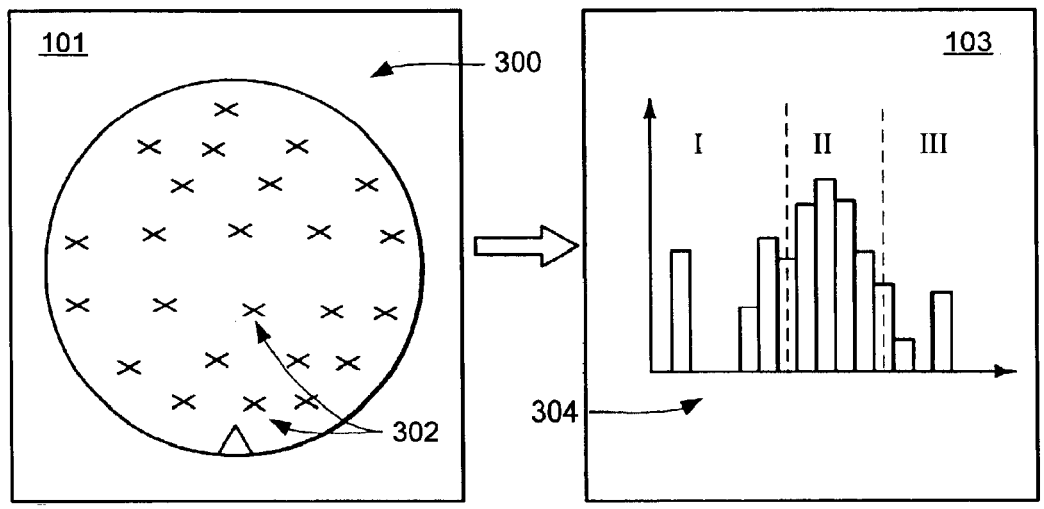
FIG. 3 is a generation block of the present invention with a semiconductor wafer subject to a physical test in accordance with the present invention.

Referring now to FIG. 3, therein is shown the generation block 101 in which a semiconductor wafer 300 is subject to a physical test in a plurality of locations 302 to determine a particular physical characteristic to provide physical data.

An example of physical data may be to measure the film thickness deposited by a specific process at a certain layer in the semiconductor processing procedure.

The physical data generated is then binned in a chart 304 of the analysis block 103, which separates the physical data into a plurality of bins, such as the bins I, II, and III.

For example, the bins I, II, and m can represent three separate ranges of thickness of film thickness on the semiconductor wafer 300. This can be viewed as three separate regions on the semiconductor wafer 300, which have been subjected to essentially three slightly different processes, or process-splits.

Figure 4:
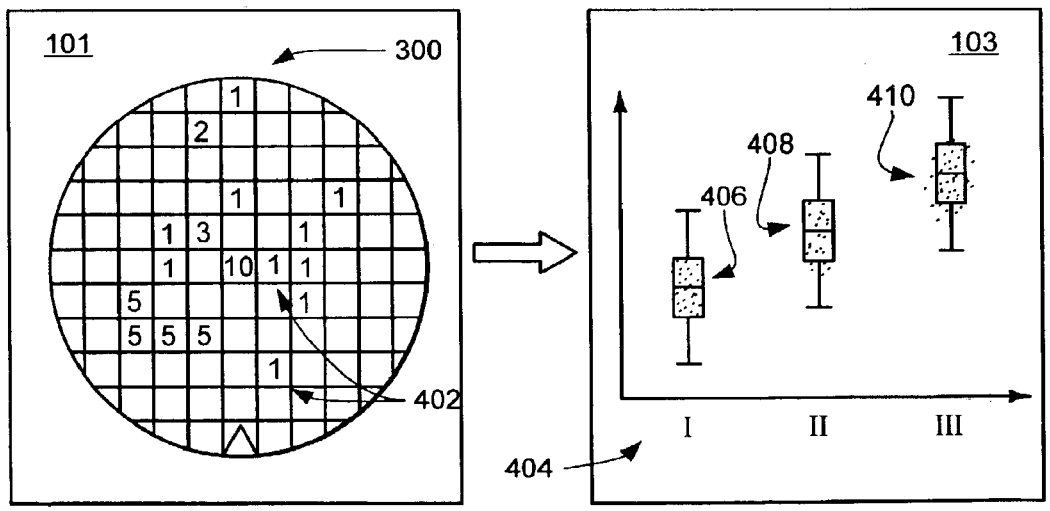
FIG. 4 is a generation block of the present invention with a semiconductor wafer subject to electrical testing in accordance with the present invention.

Referring now to FIG. 4, therein is shown the generation block 101 having the wafer 300 subject to electrical testing in accordance with the present invention. The electrical testing is generally performed on semiconductor devices 402 which are approximately in the same locations 302 of FIG. 3 as where the physical tests were performed.

The physical data and the electrical data are then correlated on a chart to show the electrical data characteristics of the process-split location on a chart, such as a box chart 404.

The box chart 404 displays electrical data 406, 408, and 410, which are respectively related to the process-splits I, II, and III, respectively.

Process FEM can be performed at a layer at the same time as the nonphotolithographic processing, and the final electrical tests can be compared to the design margin to determine pass/fail of both the process as well as individual semiconductor die.

The above thus allows determination of nonphotolithographic wafer process-splits in integrated circuit technology development Many parametric tests involve the generation of multiple sets of data or families of curves. These curves exhibit certain characteristics, such as inflection points, nodes, etc. which are indicative of product performance of known failure mechanisms. These curves are difficult to evaluate from wafer lot to wafer lot because the differences can be subtle and may only be determined by "expert" eyes.

It has been discovered by storing this data in a normalized graph form as a bitmap, jpeg, tiff, or other digital storage image, comparative techniques, such as overlaying, may be used to compare an ideal image against all other images which have been previously classified by an expert. This expert-determined ideal image allows an assignment of a value of a failure mechanism or a pass/fail criteria.

The graphs are generated as data is gathered and stored as digital images. Images are sent to an off-line server to be processed and characterized while the next test is being performed, in real time. Information necessary for disposition of the wafers or lot is available at completion of testing.

Further, it has been determined that there is a need to collect substantially large amounts of current versus voltage data.

It has been discovered that it is possible to program the tester 105 of FIG. 1 to automatically collect current versus voltage or threshold voltage distribution for all die on a wafer.

Figure 5:
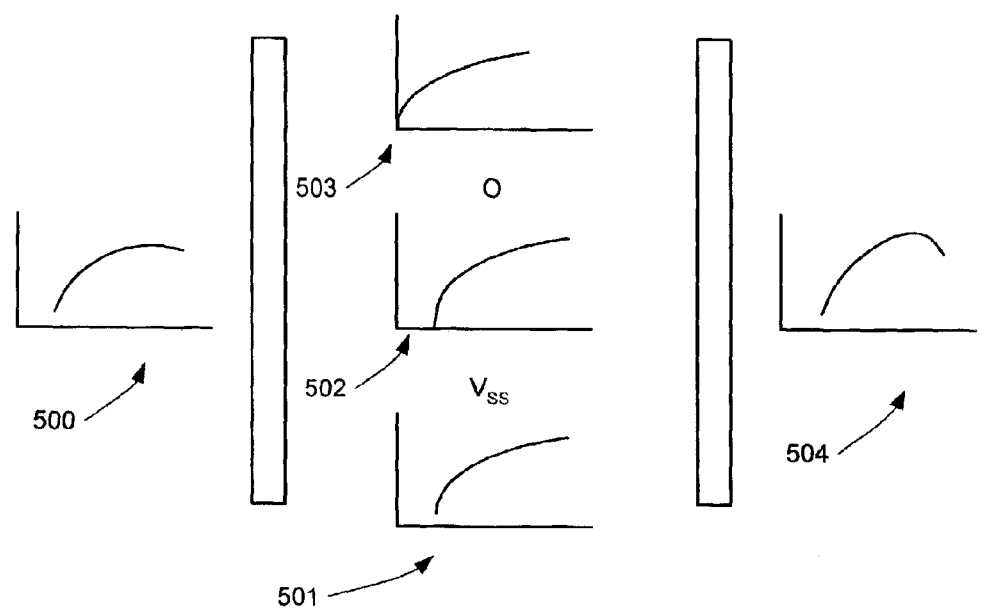
FIG. 5 is a view of the graphs necessary to accomplish fast product debugging.

Referring now to FIG. 5, therein are shown exemplary graphs 500–504 necessary to accomplish fast product debugging.

Once the automated current-voltage (I–V) data is collected based on a layout of the flash cell on a semiconductor device, the cells sharing the same contact, the same source voltage line, etc. are analyzed together with the cells potentially having polysilicon bridging problems. For example, the exemplary graphs 500–504 show five graphs of an exemplary 5-cell I–V system where the debugging efficiency can be dramatically increased.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the to be interpreted in an illustrative and non-limiting sense.

The invention claimed is:

1. A method of testing wafer process-splits in a semiconductor wafer comprising: performing a first test on a semiconductor wafer in a plurality of locations to obtain first data;

clustering the first data into a plurality of bins to obtain process-split locations;

performing second tests on the semiconductor wafer in the process-split locations to obtain second data; and correlating the first data and second data to determine process-split data.

2. The method as claimed in claim 1 wherein the performing the first test selects a test from a group consisting of thickness, chemical composition, transparency, and a combination thereof.

3. The method as claimed in claim 1 wherein the clustering the first data clusters the first data into three bins.

4. The method as claimed in claim 1 wherein the performing the second tests selects a test from a group consisting of physical tests, electrical tests, mechanical tests, functional tests, and a combination thereof.

5. The method as claimed in claim 1 wherein the correlating includes correlating the process-split data into a plurality of charts.

6. A method of testing wafer process-splits in a semiconductor wafer comprising:

performing a physical test on a semiconductor wafer in a plurality of locations to obtain physical data;

clustering the physical data into a plurality of bins to obtain nonphotolithographic process-split locations;

performing electrical tests on the semiconductor wafer in the nonphotolithographic process-split locations to obtain electrical data; and correlating the physical data and electrical data to determine nonphotolithographic process-split data.

7. The method as claimed in claim 6 wherein the performing the physical test selects a test from a group consisting of thickness tests, chemical composition tests, transparency tests, and a combination thereof.

8. The method as claimed in claim 6 wherein the clustering the physical data clusters the physical data into three bins.

9. The method as claimed in claim 6 wherein the performing the electrical tests selects a test from a group consisting of tests for threshold voltage, operating current, operating voltage, source voltage and drain voltage, and a combination thereof.

10. The method as claimed in claim 6 wherein the correlating includes correlating the nonphotolithographic process-split data into a plurality of box charts.

* * * * *